United States Patent [19]

Yung

[11] Patent Number: 4,970,724
[45] Date of Patent: Nov. 13, 1990

[54] REDUNDANCY AND TESTING TECHNIQUES FOR IC WAFERS

[75] Inventor: Michael W. Yung, Los Angeles, Calif.

[73] Assignee: Hughes Aircraft Company, Los Angeles, Calif.

[21] Appl. No.: 288,743

[22] Filed: Dec. 22, 1988

[51] Int. Cl.$^5$ .............................................. G06F 11/20
[52] U.S. Cl. .................................... 371/9.1; 364/900; 371/22.1
[58] Field of Search .................. 371/8.1, 8.2, 9.1, 11.2, 371/11.3; 364/200, 900

[56] References Cited

U.S. PATENT DOCUMENTS

| | | | |
|---|---|---|---|
| 3,302,182 | 1/1967 | Lynch et al. | 371/9.1 |
| 3,805,039 | 4/1974 | Stiffler | 371/9.1 |
| 4,239,312 | 12/1980 | Myer et al. | 339/17 N |
| 4,275,410 | 6/1981 | Grinberg et al. | 357/68 |
| 4,412,281 | 10/1983 | Works | 364/200 |
| 4,484,273 | 11/1984 | Stiffler et al. | 364/200 |
| 4,498,134 | 2/1985 | Hansen et al. | 364/200 |
| 4,507,726 | 3/1985 | Grinberg et al. | 364/200 |
| 4,524,428 | 6/1985 | Grinberg et al. | 364/200 |
| 4,745,546 | 5/1988 | Grinberg et al. | 364/200 |

OTHER PUBLICATIONS

Moore, "A Review of Fault-Tolerant Techniques for the Enhancement of Integrated Circuit Yield", Proceedings of the IEEE, vol. 74, No. 5, May 1986, pp. 684–698.

Grinberg et al., "A Cellular VLSI Architecture", Computer, Jan. 1984, pp. 69–81.

Little et al., "A Three-Dimensional Computer for Image and Signal Processing", Workshop on Generic Signal Processing, Harry Diamond Laboratories, Adelphi, Md., Jul. 1987, pp. 88–92.

L. Bentley et al., "The Implementation of a Two-Dimensional Redudancy Scheme in a Wafer Scale High-Speed Disk Memory", Architectures, pp. 187–197.

Proceedings of the IEEE, No. 5, vol. 74, May 1986, Sami et al., "Reconfigurable Architectures for VLSI Processing Arrays", pp. 712–722.

IEEE, 1985, Singh, "An Area Efficient Redundancy Scheme for Wafer Scale Processor Arrays", pp. 505–509.

Controller HMSO, London, 1986, Evans et al., "Wafer Scale Integration Based on Self-Organisation", pp. 101–112.

Singh, Interstitial Redundancy: An Area Efficient Fault Tolerance Scheme for Large Area VLSI Processor Arrays, IEEE Transactions on Computers, vol. 37, No. 11, Nov. 1988, pp. 1398–1410.

*Primary Examiner*—Charles E. Atkinson
*Attorney, Agent, or Firm*—V. D. Duraiswamy; P. M. Coble; W. K. Denson-Low

[57] ABSTRACT

An array of processing element nodes are provided on a semiconductor wafer. A mixed redundancy approach is preferably employed wherein two spare core logic circuit modules 52, 58 are available for use at each node. Each spare core logic module can be connected to one of four different nodes. An H-net 94 interconnects adjacent nodes in such manner that faults in the circuit modules can be easily tested and repaired.

13 Claims, 5 Drawing Sheets

REDUNDANCY AND TESTING TECHNIQUES FOR IC WAFERS

The U.S. Government has certain rights in this invention pursuant to contract No. F30602-87-C-0049 awarded by the Department of the Air Force.

BACKGROUND

1. Technical Field

This invention relates to integrated circuit devices and, more particularly, to techniques for testing and repairing them.

2. Related Art

Real time image processing and two dimensional data processing, in general, require enormously high data throughput capabilities. Concurrent or parallel processing appears to be the most feasible route to achieve these extraordinary processing rates. There are additional constraints if these systems are to find widespread use. For example, they must be moderate in size and cost. While general purpose supercomputers such as the Cray XMP, Cyber 205, Hitachi S-810 and the like exhibit relatively fast processing speeds, they fall far short of the size and cost constraints that would make them economically attractive.

A cellular array three-dimensional computer (3-D computer) with one processor assigned to each pixel or matrix element of the input data is described in the following documents: Grinberg et al., "A Cellular VLSI Architectural", Computer pp. 69–81 (Jan. 1984); Little et al., "A Three Dimensional Computer For Image and Signal Processing", Proceedings of Workshop on Generic Signal Processing, Maryland pp. 88–92 (July 1987) and commonly assigned U.S. Pat. No. 4,275,410 entitled "Three-Dimensionally Structured Microelectronic Device" by Grinberg et al., issued June 23, 1981; U.S. Pat. No. 4,507,726 entitled "Array Processor Architecture Utilizing Modular Elemental Processors" by Grinberg et al., issued Mar. 26, 1985; U.S. Pat. No. 4 239,312 entitled "Parallel Interconnect for Planar Arrays" by Myer et al., issued Dec. 16, 1980; U.S. Pat. No. 4,524,428 entitled "Modular Input-Programmable Logic Circuits for Use in a Modular Array Processor" by Grinberg et al., issued June 18, 1985; U.S. Pat. No. 4,498,134 entitled "Segregator Functional Plane for Use in a Modular Array Processor" by Hansen et al., issued Feb. 5, 1985; and U.S. Pat. No. 4,745,546 entitled "Column Shorted and Full Array Shorted Functional Plane for Use in a Modular Array Processor and Method for Using Same" by Grinberg et al, issued May 17, 1988. The 3-D computer employs a very high degree of integration in its construction. This level of integration is made possible by, among other things, the development of technologies that permit massively parallel communication channels between silicon wafers and through silicon wafers. These channels enable the wafers to be stacked one on top of another to form a three dimensionally integrated computer.

FIG. 1 illustrates a schematic view of the aforementioned 3-D computer. The computer 10 generally consists of a plurality of stacked silicon wafers each containing an array of processing elements (PEs). All PEs on a particular wafer are identical yet they may differ from wafer to wafer. For example, the PEs on wafer 12 and 26 are an array of shift registers or shifters, the PEs on wafers 14, 16 and 20 are an array of accumulators, the PEs on wafers 24 are an array of comparators, the PEs on wafer 18 are an array of replicators, and the PEs on wafer 22 are an array of counters. Signals are passed vertically through the stack of wafers by bus lines composed of feed-throughs (signal channels through the wafers) and microbridges (signal channels between the wafers). In FIG. 1, the vertical lines represent the massively parallel communication channels. The vast majority of these communication channels are used for the $N \times N$ data bus line. The remaining communication channels are used for a control bus and address bus.

In the aforementioned 3-D computer 10 it is only necessary for the shifter wafers 12, 26 and replicator wafer 18 to provide for lateral communication between the PEs on each wafer, i.e., neighborhood connections between PEs. This interprocessor communication requirement increases circuit complexity thereby highlighting the need for increased yield and testability.

Since the aforementioned 3-D computer uses a wafer-scale integration approach, serious consideration must be given to the issue of yield. The use of redundant circuitry has been suggested in the past to improve functional yields. A redundant circuit is a spare circuit identical to the primary circuit which can be used in place of a faulty primary circuit.

Many redundancy approaches for array-type circuits have been proposed in the literature for both yield enhancement and fault tolerance. A good discussion of such techniques is discussed in Moore, "A Review of Fault-Tolerant Techniques for the Enhancement of Integrated Circuit Yield", Proc. of the IEEE, Vol. 74, No. 5, pp. 684–698 (May 1986). One of the earliest approaches used by memory designers is to include spare rows and/or columns as discussed in Cenker et al., "A Fault Tolerant 64K Dynamic Random Access Memory", IEEE Tran. Electron Devices, Vol. ED-27, No. 6, pp. 853–860 (June 1979). A complete row (column) is discarded when that row (column) contains defects. This approach, however, is very inefficient when applied to large two dimensional arrays such as the aforementioned 3-D computer. Recent developments involve more elaborate schemes of global reconfiguration, bypassing faulty PEs individually rather than the whole row or column. See, for example, L. Bentley and C. R. Jesshope, "The Implementation of a Two Dimensional Redundancy Scheme in a Wafer-Scale High-Speed Disk Memory", Wafer Scale Integration, C. R. Jesshope and W. R. Moore, Eds. Bristol, U.K.: Adam Hilger, 1986, pp. 187–197; R. A. Evans et al., "Wafer Scale Integration Based on Self-Organization", Wafer Scale Integration, C. R. Jesshope and W. R. Moore, Eds. Bristol, U.K.: Adam Hilger 1986, pp. 101–112; and M. Saml and R. Stefanelli, "Reconfigurable Architectures for SLSI Processing Arrays", Proc. of the IEEE, Vol. 74, No. 5, pp. 712–722, May 1986. These approaches usually do not require a large number of spare PEs (less than 50 percent of the number of primary PEs). Unfortunately, they do carry high area overhead in the form of complex switches and interconnects, while also requiring rather sophisticated global reconfiguration algorithms. Another approach is to provide interstitial redundancy where the redundant PEs are more uniformly distributed in the array and are local to the faulty elements. See, for example, A. D. Singh, "An Area Efficient Redundancy Scheme for Wafer Scale Processor Arrays", Proc. of IEEE Int'l Conf. on Computer Design, pp. 505–509 Oct. 1985.

In the 3-D computer referenced above, any redundancy scheme that requires complex overhead circuitry such as multiple-position switches and long interconnects would not be very area-efficient. Moreover, because of the vertical interconnecting structure between wafers, each system node consists of circuits from the corresponding locations of PEs in all of the wafers in the stack. Thus, those prior redundancy schemes which would require physical abandonment of any node would not be very feasible.

In the papers disclosing the aforementioned 3-D computer, a 1:1 redundancy scheme was discussed, i.e., one redundant PE for each primary PE. As the integration level increases (for example, towards a 128×128 PE array) the overhead of a 1:1 redundancy scheme is a heavy price to pay in terms of both area and testing time and the complexity of the testing apparatus. Thus, a 1:1 redundancy scheme may no longer be cost-effective as the integration level increases. In addition, the availability of only one spare PE per node may not be adequate to provide high yields, particularly if cluster defects exist.

As the level of integration increases, it also becomes more difficult to test each of the PEs due to their small size and more complex interconnection. This is especially true where they do not have an easily accessible external contact point which can be tested.

SUMMARY OF THE INVENTION

In accordance with one aspect of this invention, an integrated circuit semiconductor wafer is provided that contains an array of processing elements (PEs). Each PE contains primary core logic circuit means (CR), primary communication logic means (CM) and primary communication interconnect means (CMI). A mixed redundancy approach is employed which uses distinct sparing and substitution approaches. This approach minimizes the overhead of the circuitry that does not involve inter-PE communication while reducing the complexity of communication interconnects between PEs without sacrificing yield. In this mixed approach, a plurality of redundant or spare core logic means is provided for each primary core logic means and provision is made for selectively connecting each spare to one of a plurality of primary core logic means. In the preferred embodiment, two potential spares are provided for each primary CR and each spare CR can be used by one of four primary core logic means. In contrast, only one redundant circuit is respectively provided for the simpler communication logic means (CM) and communication interconnect means (CMI).

According to another aspect of this invention, neighboring processing elements and their associated redundant circuits are connected by way of a H-net configuration. Portions of the H-net can be cut during testing to isolate faults in the neighborhood communication logic or interconnects.

BRIEF DESCRIPTION OF THE DRAWINGS

The various advantages of the present invention will become apparent to one skilled in the art upon reading the following specification and by reference to the drawings in which.

DESCRIPTION OF THE PREFERRED EMBODIMENT

Figure 1:
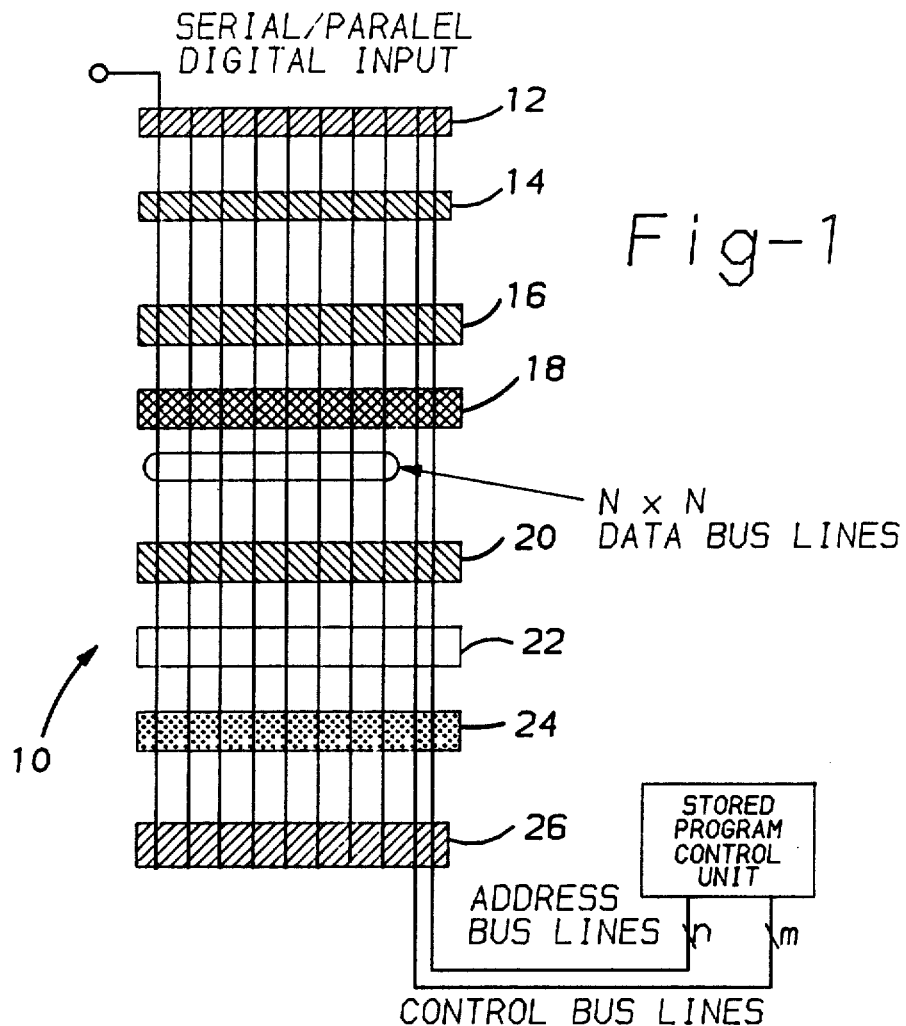
FIG. 1 is a schematic representation of a 3-D computer in which the present invention finds particular utility.

The present invention will be described in connection with the shifter wafers 12 and 26 previously discussed in connection with FIG. 1, although the scope of the invention need not be so limited.

Figure 2:
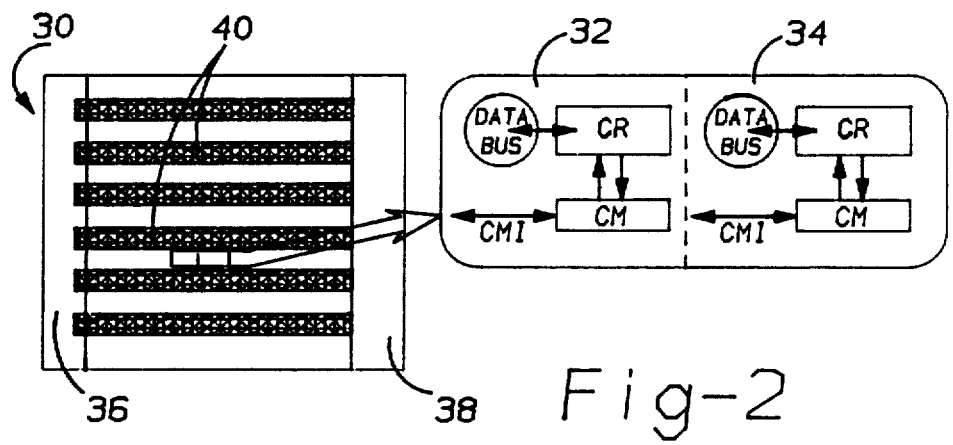
FIG. 2 is a schematic diagram showing the general floor plan of one of the stacked wafers used in the computer of FIG. 1.

FIG. 2 illustrates the general floor plan of one of these wafers and is generally designated by the numeral 30. It contains an N×N array of processing elements (PEs). Two adjacent processing elements 32, 34 are shown in the exploded portion of this Figure. The PEs of this wafer contain circuitry that can be divided into several functional circuit module categories: core logic (CR), communication logic (CM) and communication interconnects (CMI). CR covers most of the PE, and often has hundreds of logic gates. It performs data manipulation and processing of data which can be loaded and read from the PE's data bus. CM and CMI perform simpler functions and typically use fewer gates, on the order of 4–20 gates. CM functions to control data transfer between PEs. The CMI is the electrically conductive path which carries data between the PEs.

Operating as a single instruction multiple data (SIMD) machine, every PE on a wafer is controlled by the same instructions which are processed and stored in control logic (CT) 36 and 38 on either side of the wafer. These instructions are distributed to the array via the control interconnect (CTI) lines 40 illustrated as running horizontally in FIG. 2.

Figure 3:
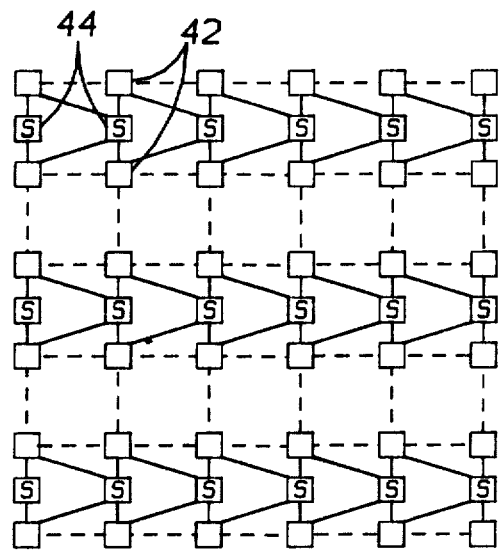
FIG. 3 is a diagram illustrating the shared interconnection of redundant core logic circuits between an array of PEs.

Turning now to FIG. 3, the redundancy approach of one aspect of the present invention will now be described. The unlabeled squares represent an array of primary PEs 42 on a wafer. A node is an area of the wafer that contains a sufficient number of primary and redundant functional circuit modules (CR, CM, CMI) that can be connected together to form one functioning PE. In accordance with the present invention, a plurality of spare or redundant core logic circuit modules (CR) 44 are available to each node and each redundant module is selectively connectable to one of a plurality of different nodes. In the preferred embodiment there are two redundant or spare CR modules 44 that are available for use by each node. In addition, each spare CR module 44 can be shared by four PE nodes 42. Significantly improved yields are achievable since each node has two redundant CR modules 44 available to it. Thus, if one redundant CR module is faulty, a node can use the other spare CR module available to it. On the other hand, since the redundant modules are not needed very frequently, each module 44 can support four nodes without degrading the yield appreciably. The above approach can be referred to as (m, n) redundancy where m is the number of spare circuit modules available for each node and n is the number of nodes that each module can potentially support. Thus, the preferred approach just described has (2, 4) redundancy.

Figure 4:
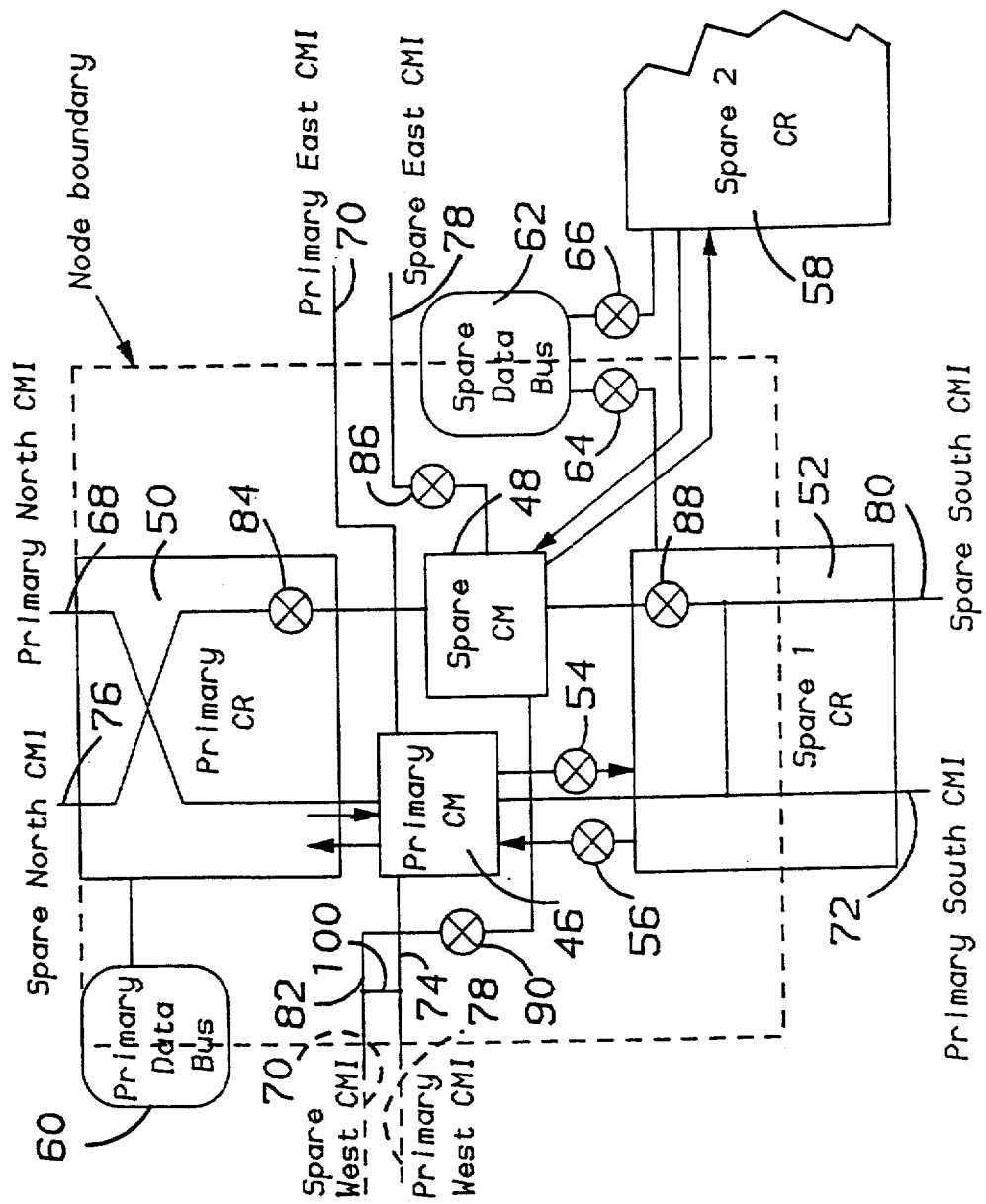
FIG. 4 is a schematic diagram showing in more detail the redundant scheme employed by the preferred embodiment of the present invention.

The (2, 4) redundancy scheme for the nearest neighbor communication circuits (CM, CMI) may create complex interconnection patterns that may be difficult to lay out and require excessive repair operations. Accordingly, a mixed redundancy approach can be employed wherein the (2, 4) redundancy scheme is used for the core logic circuit module, but a (1, 1) redundancy scheme is used for the CM and CMI. This approach is shown in FIG. 4. At each node, there are two CM circuit modules; a primary CM 46 and redundant or spare CM 48. The primary CM 46 is directly connected to the primary CR 50.

The primary CM 46 is also connected to the first redundant or spare CR 52 through switches 54 and 56. All of the switches in FIG. 4 are of the normally open type and can be fabricated in many ways such as by using typical CMOS fabrication processes wherein bias to a transistor or gate can be selectively applied to cause it to conduct ("ON" state) by appropriately cutting metallic lines associated with the transistor. The spare CM 48 is directly connected to the second redundant or spare CR module 58. Note that spare CR modules 52 and 58 are shared with three other nodes as discussed in connection with FIG. 3.

The primary data bus 60 is directly connected to primary CR 50 whereas spare data bus 62 is connected via switches 64 and 66 to spare CR 52 and spare CR 58, respectively. The primary north CMI 68, primary east CMI 70, primary south CMI 72 and primary west CMI 74 provide electrical interconnection for data transfer to the core logic modules (CRs) of the north, east, south, and west PEs, respectively, under the control of the primary CM 46. Spare CMIs 76, 78, 80 and 82 are connected to the spare CM 48 via switches 84, 86, 88 and 90, respectively. Thus, it can be seen that a (1, 1) redundancy approach is provided for the CMs and CMIs while a (2, 4) redundancy approach is provided for the CR circuit modules. It should be understood that the mixed redundancy scheme of the present invention can be used in different node layouts where the connections between spare and primary circuit modules may differ from that shown in FIG. 4.

Figure 5:
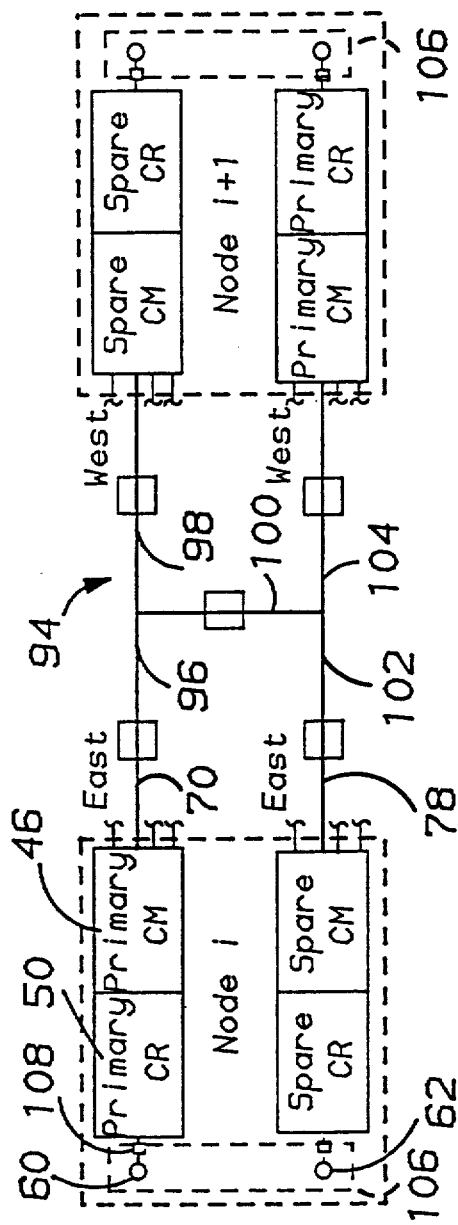
FIG. 5 is a schematic diagram showing a H-net interconnection between neighboring nodes.

The primary and spare circuit modules in adjacent nodes are connected together in a "H-net" as illustrated schematically in FIG. 5. To the extent possible, node "i" represents the node illustrated in previous FIG. 4 and bears the same reference numerals, with the exception that the first spare CR 52 has been eliminated for sake of simplicity. Thus, this aspect of the invention has applicability to a wide variety of redundancy approaches such as the (1, 1) approach illustrated in FIG. 5 as well as the mixed redundancy approach previously discussed. Similarly, the mixed redundancy of this invention can be used without the "H-net" construction although the combination does provide preferred results.

The H-net 94 consists of five branches 96, 98, 100, 102, and 104 connected together in a generally H-shaped pattern which has been rotated 90 degrees. Branches 96 and 98 will be hereinafter referred to as the upper route, and branches 102 and 104 will be referred to as the lower route. Branch 100 will be referred to as the cross or middle bar. Thus, the
upper route, 96, 98 electrically connects the primary CM 46 to a spare CM of an adjacent node i+1. The lower route connects the spare CM of node i to the primary CM in adjacent node i+1. The middle bar 100 connects the upper and lower routes together. All of the branches are made of preselected conductive material and are located within the wafer so that they can be cut by external apparatus such as by laser cutting, ultrasonic probes or focused ion beams.

It should be noted that the north, south, and west neighbors of the illustrated nodes are likewise connected together in the aforementioned H-net configuration.

The primary and spare CRs each have an associated data bus pad 60 and 62, respectively, connected thereto. These two pads are not initially connected together via microbridge 106 until after testing. Thus, both pads 60 and 62 are accessible by external probes for generating test signals and reading the result. If a primary CR is faulty, it is cut off from its associated node 60 at, for example, point 108 in FIG. 5.

If the primary CR for a node is bad, then the spare CR is tested. If the spare CR is also bad, then, the whole wafer would have to be discarded if a (1, 1) redundancy approach is used. However, if the (2, 4) redundancy approach of FIG. 4 is used, instead of discarding the wafer it can be used if the second spare CR is good.

The testing and identification of faulty circuit modules is particularly difficult with the interprocessor communication modules CM and CMI. This is because they do not have a bus pad directly connected to them so that they can be probed and tested independently as possible for the CRs. Let us assume that all of the CRs were tested and passed. The next step is to test interprocessor communication. This can be done in various ways such as by simultaneously sending test signals applied at pads 60 and 62 to adjacent nodes and reading the results at the data pads of the adjacent nodes. One of the most common communication faults is known as "stuck-at" fault which effectively shorts the communication paths to ground or to the power supply voltage so that the proper result is not received at the receiving node. If the wafer does have such faults, then it would otherwise be difficult to determine whether the fault lies with any of the four CMs or four CMIs shown in FIG. 5. However, the H-net configuration aids in this determination. If there is bad communication between adjacent nodes, the middle bar 100 is cut to isolate the upper and lower routes. Then, the communication is tested again by sending test signals from pads 60 and 62 in node i and reading them at the pads in node i+1. If there is good communication in one route but faulty communication in another route, then the CRs and CMIs associated with the faulty route are cut out. For example, if there is bad communication in the upper route but not in the lower route, then, the point 108 is cut to isolate primary CR 50 from its pad 60 and, similarly, the spare CR in node i+1 is cut from its pad. In addition, CMI 70 (as well as the interconnects to the north, south, and west node neighbors) will be cut. In addition, the north, south, east and west CMIs for node i+1 will also be cut.

Finally, the microbridges 106 are fabricated after all internal testing of the wafer circuit modules have been completed. In the above example where the upper route is faulty, the communication path between the nodes in FIG. 5 is through the lower route since the CRs and CMIs in the upper route are cut. Thus, only good nodes are connected together in the final processed array wafer.

Figure 6A:
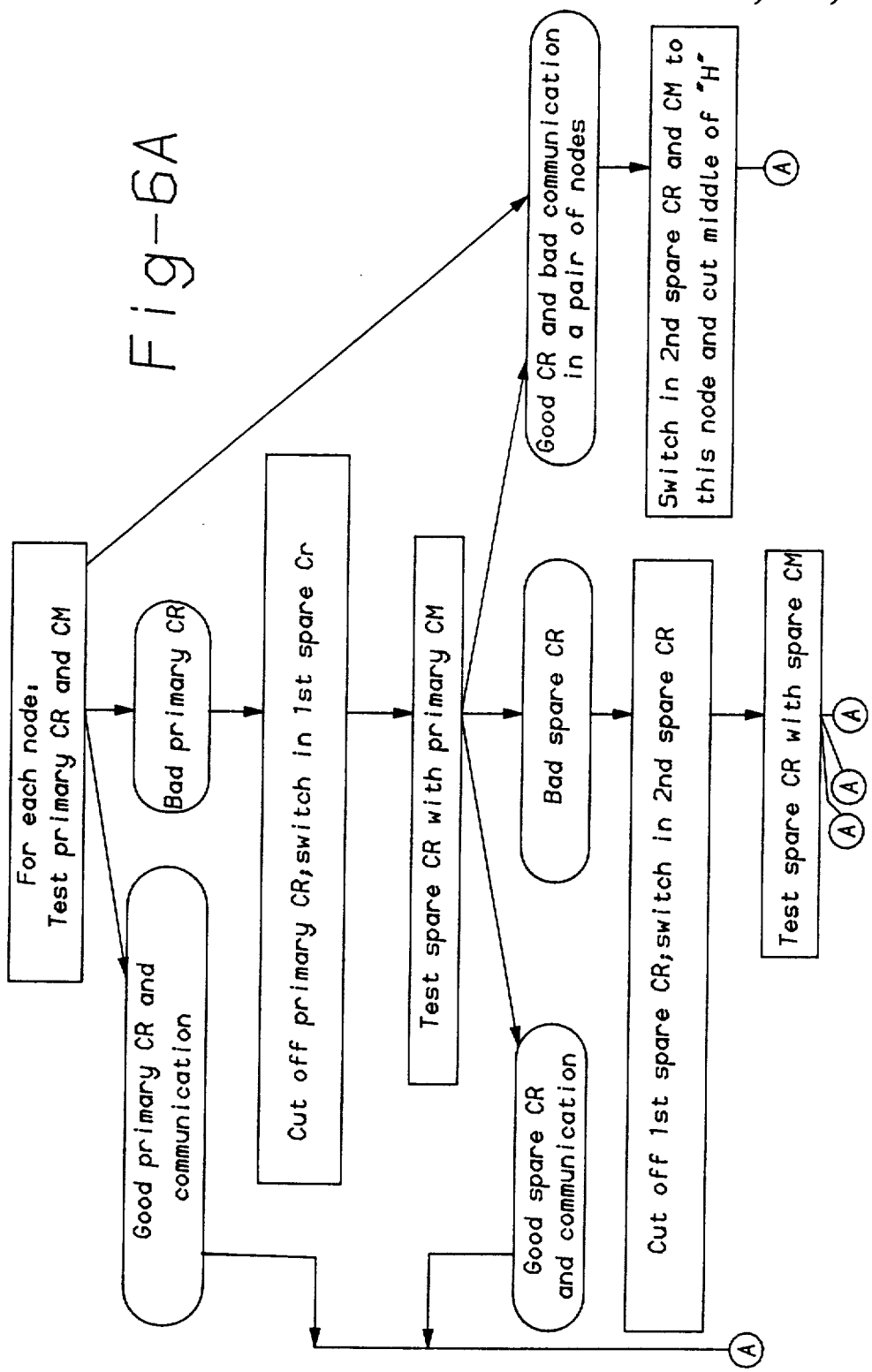
FIGS. 6A and 6B show a flow chart of the testing and repair procedure of a wafer made in accordance with the teachings of this invention.
Figure 6B:
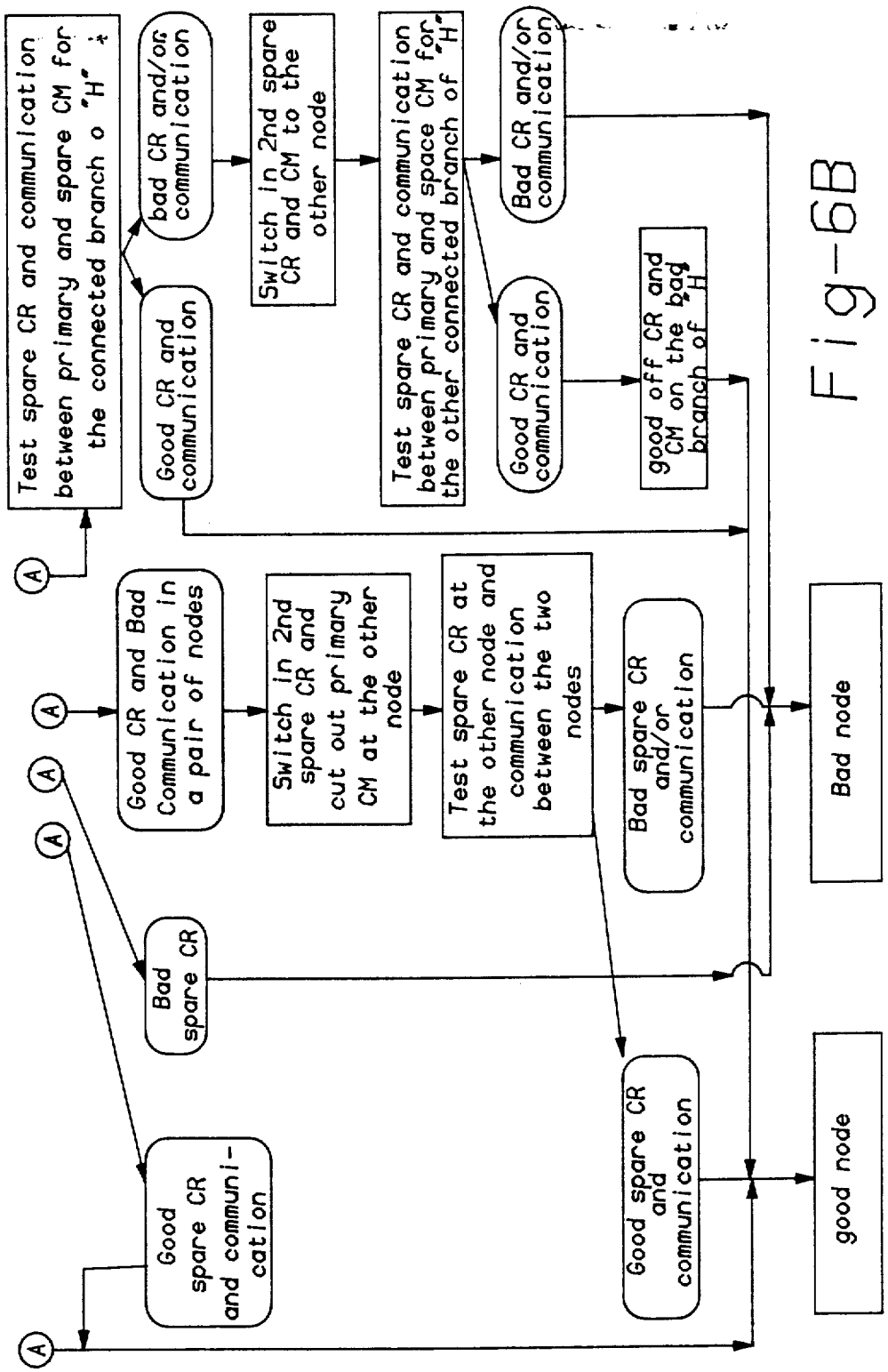

FIGS. 6A and 6B show a flow chart of the steps which have been described above. In addition, it sets forth certain switching operations in which spare CRs and spare CMs are switched into the node if, for example, the redundancy approach illustrated in FIG. 4 is employed. As can be seen from the flow chart of FIGS. 6A and 6B, the H-net configuration and mixed redundancy approach of the present invention cooperate to provide a testing sequence that is relatively easy to perform since the application of the test signals, isolation of the faulty modules and switching in of the spare modules as necessary can be carried out in a straightforward manner.

In view of the foregoing, those skilled in the art can now appreciate that the present invention provides improved techniques for increasing the yields and testability of array processors fabricated on semiconductor wafers. It should be understood, however, that while this invention has been herein described in connection with several examples thereof, that other modifications and variations will be contemplated by one skilled in the art upon a study of the specification, drawings and following claims. It is intended therefore, that the invention not be limited solely to the described embodiments. Various modifications and variations are contemplated and can be made without departing from the spirit and scope of the invention, as hereinafter defined by the appended claims.

What is claimed is:

1. An integrated circuit semiconductor wafer comprising:
   an array of primary processing elements (PEs), each PE having primary core logic (CR) circuit means for processing data, primary communication logic (CM) circuit means for controlling data transfer between PEs, and primary communication interconnect (CMI) circuit means for carrying the data between PEs;
   a plurality of redundant core logic circuit means for each primary core logic circuit means;
   means for selectively connecting one of the redundant core logic circuit means to one of a plurality of primary core logic circuit means;
   one redundant communication logic circuit means for each primary communication logic circuit means in each PE; and
   one redundant communication interconnect circuit means for each primary communication interconnect circuit means for each PE.

2. The wafer of claim 1 which further comprises:
   switch means for selectively connecting one redundant core logic circuit means to said primary communication logic circuit means and to said redundant communication logic circuit means; and
   another redundant core logic circuit means being directly connected to said redundant communication logic circuit means.

3. An integrated circuit device having an array of nodes, said device comprising:
   a plurality of functional circuit modules for each node, each node including a primary core logic circuit module (CR), one primary and one spare communication logic circuit module (CM), as well as one primary and one spare communication interconnect means (CMI) for carrying data between neighboring nodes; and
   said device further comprising a plurality of spare core logic circuit modules;
   each node being connectable to at least two of said spare core logic circuit modules thereby providing each node with at least two potential spare core logic circuit modules;
   each of said spare core logic circuit modules being selectively connectable to four nodes; whereby a faulty primary core logic module in each node can be replaced with one of two spares, with each spare being connectable to four different nodes.

4. The device of claim 3 which further comprises:
   H-net means for connecting together adjacent nodes such that a first pair of CMs in adjacent nodes are connected together along one route, with another pair of CMs being connected together along another route, with the two routes being electrically connected together by a middle bar which can be cut by external apparatus to isolate the two routes during testing to aid in detecting faulty circuits.

5. The device of claim 4 which further comprises:
   a data bus pad for the primary CR and a data bus pad for the spare CR in each node, and connection means for connecting the CRs to their respective data pads, the connection means being such that it can be cut to isolate a faulty CR from its data bus pad.

6. A computer comprising:
   a plurality of stacked semiconductor wafers, each said wafer having an array of nodes communicating with corresponding nodes on other wafers, selected wafers having nodes which also communicate with other nodes on the same wafer, each node on said selected wafers including:
   a primary core logic circuit means for processing data, a primary communication logic circuit means (CM) directly connected to the primary CR for controlling data transfer between nodes;
   a spare CM;
   a primary communication interconnect (CMI) circuit means for carrying data between nodes;
   a spare CMI switch connected to the primary CMI;
   a primary data bus directly connected to the primary CR;
   a spare data bus; and
   said wafer further comprising an array of spare CRs arranged such that each node is connectable to two spare CRs and such that each spare CR is connectable to four nodes.

7. The computer of claim 6 which further comprises switch means for selectively connecting a first spare CR to the primary CM.

8. The computer of claim 7 wherein a second spare CR is directly connected to the spare CM of each node.

9. The computer of claim 8 which further comprises:
   switch means for selectively connecting the first spare CR to the spare data bus; and
   switch means for selectively connecting the second spare CR to the spare data bus.

10. An integrated circuit semiconductor wafer comprising:
    an array of nodes, each node having a primary core logic (CR) circuit means for processing data and a primary communication logic (CM) means for controlling transfer of data between nodes; said node further including at least one spare CR connected to at least one spare CM; and
    H-net means for connecting together adjacent nodes such that a first pair of CMs in adjacent nodes are connected together along one route, with another pair of CMs being connected together along another route, with the two routes being electrically connected together by a middle bar which can be cut by external apparatus to isolate the two routes during testing to aid in detecting faulty circuits.

11. The wafer of claim 10 which further comprises:
a data bus pad for the primary CR and a data bus pad for the spare CR in each node, and connection means for connecting the CRs to their respective data pads, the connection means being such that it can be cut by external apparatus to isolate a faulty CR from its data bus pad.

12. A method of testing and repairing a semiconductor wafer having an array of nodes thereon, each node including at least one primary core logic (CR) means for processing data which is connected to a primary communication logic (CM) means for transferring data between nodes, a spare CR connected to a spare CM, a primary data bus pad connected to the primary CR and a spare data bus pad connected to the spare CR, said method comprising:

connecting adjacent nodes together in a generally H-shaped configuration wherein one pair of CMs in adjacent nodes are connected together along a first route, with another pair of CMs in adjacent nodes being connected together along a second route, both routes being connected together by a middle bar portion;

testing each CR and disconnecting it from its associated data bus pad if it is faulty;

thereafter, generating test signals at the primary and spare data bus pads at one node and reading the results at the pads of an adjacent node;

cutting the middle bar if improper test signals are received to thereby isolate the first and second routes;

regenerating the test signals over the isolated first and second routes;

disconnecting from adjacent nodes the CRs and CMs in a route where improper test results are received.

13. The method of claim 10 which thereafter comprises:

electrically connecting the primary and spare data bus pads together.

* * * * *